(12) United States Patent
Passoni et al.

(10) Patent No.: US 11,579,273 B2
(45) Date of Patent: Feb. 14, 2023

(54) METHOD OF OPERATING ELECTRO-ACOUSTIC TRANSDUCERS, CORRESPONDING CIRCUIT AND DEVICE

(71) Applicant: STMicroelectronics S.r.l., Agrate Brianza (IT)

(72) Inventors: Marco Passoni, Cornate d'Adda (IT); Niccolò Petrini, Florence (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/570,120

(22) Filed: Jan. 6, 2022

(65) Prior Publication Data
US 2022/0128674 A1    Apr. 28, 2022

Related U.S. Application Data

(63) Continuation of application No. 16/810,042, filed on Mar. 5, 2020, now Pat. No. 11,243,299.

(30) Foreign Application Priority Data

Mar. 12, 2019    (IT) .................. 102019000003613

(51) Int. Cl.
| | |
|---|---|
| *G01S 7/52* | (2006.01) |
| *B06B 1/06* | (2006.01) |
| *G01S 7/524* | (2006.01) |
| *G01S 7/527* | (2006.01) |

(Continued)

(52) U.S. Cl.
CPC ............ *G01S 7/52004* (2013.01); *B06B 1/06* (2013.01); *G01S 7/524* (2013.01); *G01S 7/5273* (2013.01);
(Continued)

(58) Field of Classification Search
None
See application file for complete search history.

(56) References Cited

U.S. PATENT DOCUMENTS

| | | | |
|---|---|---|---|
| 5,267,219 A | 11/1993 | Woodward | |
| 5,335,545 A | 8/1994 | Leszczynski | |

(Continued)

OTHER PUBLICATIONS

Przybyla et al., "3D Ultrasonic Gesture Recognition," IEEE International Solid-State Circuits Conference, Session 12, Sensors, MEMS, and Displays, 12.1, Feb. 11, 2014, 3 pages.

(Continued)

*Primary Examiner* — Isam A Alsomiri
*Assistant Examiner* — Vikas Atmakuri
(74) *Attorney, Agent, or Firm* — Seed Intellectual Property Law Group LLP

(57) ABSTRACT

A method of operating electro-acoustical transducers such as PMUTs involves applying to the transducer an excitation signal over an excitation interval, acquiring at the transducer a ring-down signal indicative of the ring-down behavior of the transducer after the end of the excitation interval, and calculating, as a function of said ring-down signal, a resonance frequency of the electro-acoustical transducer. A bias voltage of the electro-acoustical transducer can be controlled as a function of the resonance frequency. An acoustical signal received can be transduced into an electrical reception signal and a damping parameter of the electro-acoustical transducer can be calculated as a function of the ring-down signal so that a cross-correlation reference signal can be synthesized as a function of the resonance frequency and the damping ratio of the electro-acoustical transducer. Such a cross-correlation reference signal can be used for cross-correlation with the electrical reception signal to improve the reception quality.

20 Claims, 9 Drawing Sheets

(51) Int. Cl.
  *G01S 15/10* (2006.01)
  *G01S 15/931* (2020.01)
  *H01L 41/09* (2006.01)
  *H03L 7/093* (2006.01)
(52) U.S. Cl.
  CPC ............ *G01S 15/10* (2013.01); *G01S 15/931* (2013.01); *H01L 41/09* (2013.01); *H03L 7/093* (2013.01); *B06B 2201/55* (2013.01)

(56) References Cited

U.S. PATENT DOCUMENTS

| | | | |
|---|---|---|---|
| 7,004,031 | B2 | 2/2006 | Oda et al. |
| 7,006,641 | B1 | 2/2006 | Saiki et al. |
| 10,768,706 | B1 | 9/2020 | Wang et al. |
| 2003/0039173 | A1 | 2/2003 | Yurchenko et al. |
| 2010/0011471 | A1 | 1/2010 | Jesse et al. |
| 2013/0181573 | A1 | 7/2013 | Hines et al. |
| 2016/0380640 | A1 | 12/2016 | Boser et al. |
| 2017/0074977 | A1 | 3/2017 | Koudar et al. |
| 2017/0115382 | A1 | 4/2017 | Koudar et al. |
| 2017/0168151 | A1 | 6/2017 | Kim |
| 2019/0033434 | A1 | 1/2019 | Ding et al. |

OTHER PUBLICATIONS

Svilainis et al., "Optimization of the Ultrasonic Excitation Stage," Proceedings of the ITI 2008 30$^{th}$ International Conference on Information Technology Interfaces, Jun. 23-26, 2008, Cavtat, Croatia, pp. 791-796.

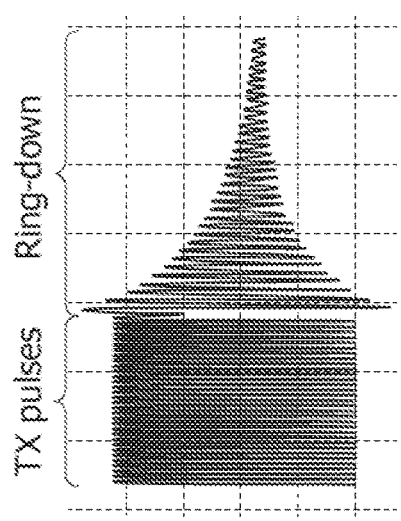
FIG. 1
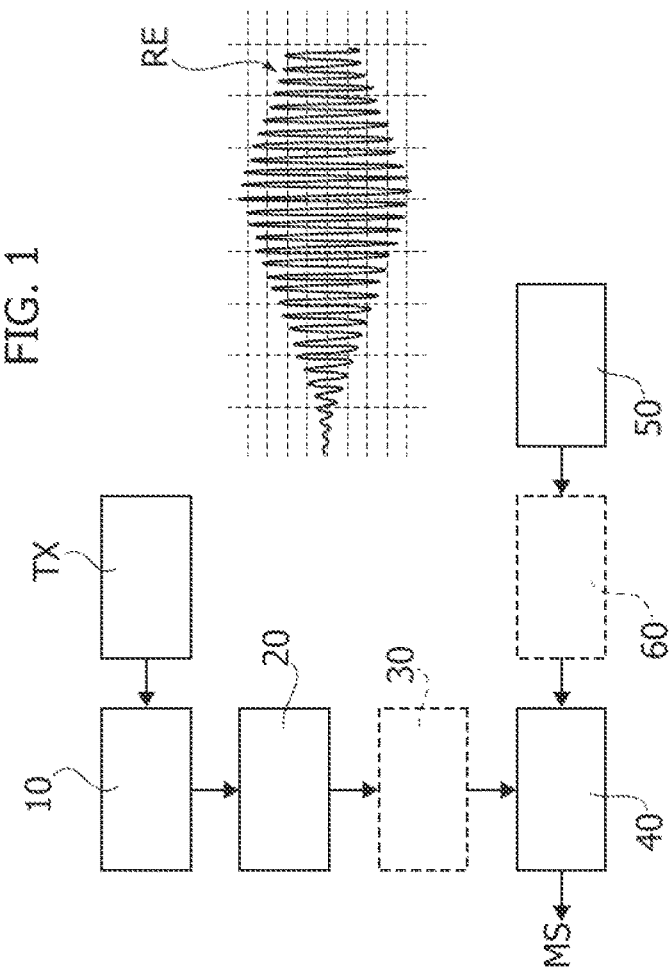
FIG. 2
FIG. 3
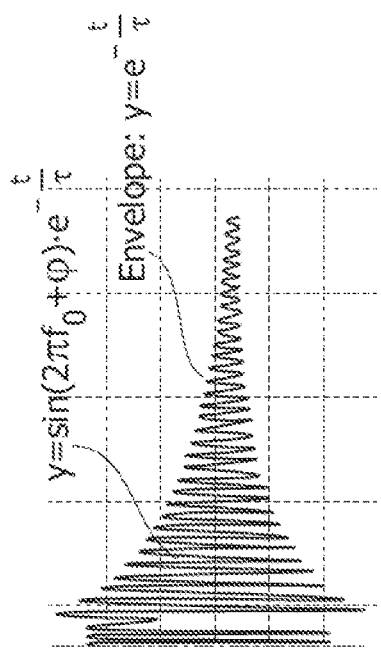
FIG. 4
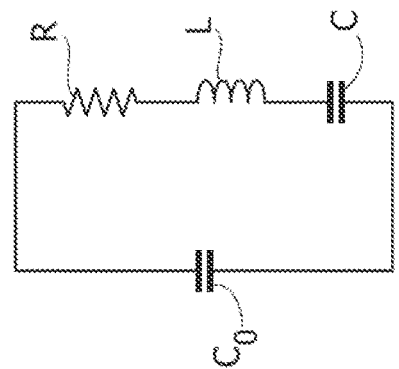

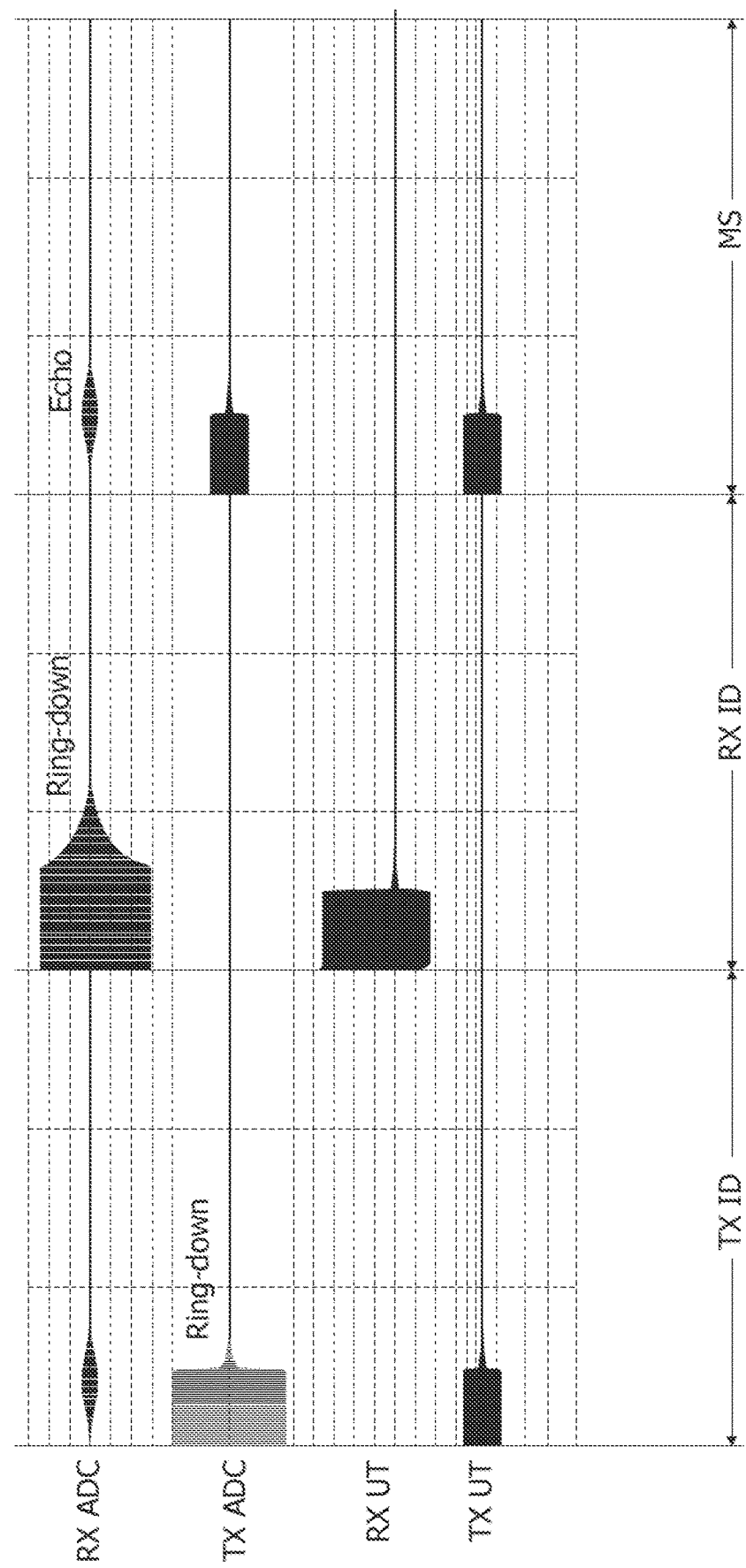

METHOD OF OPERATING ELECTRO-ACOUSTIC TRANSDUCERS, CORRESPONDING CIRCUIT AND DEVICE

BACKGROUND

Technical Field

The description relates to techniques involving the use of electro-acoustic transducers, that is components capable of converting electrical signals into acoustic signals and/or converting acoustic signals into electrical signals.

Ultrasonic transducers are exemplary of such transducers.

Description of the Related Art

Ultrasonic transducers can be considered for use in various applications such as acoustic location methods, wherein (ultra)sound waves can be used to determine the distance and/or the direction of a source or reflector.

Techniques based on the Doppler effect and/or measuring the time-of-flight (TOF) of sound waves are exemplary of other areas where such transducers can be used.

Obstacle detection (mono-, bi-, three-dimensional), volume measurement, gesture recognition and (Doppler-based) flow metering and are exemplary of possible fields of application.

Ultrasonic transducers currently referred to as PMUTs (Piezoelectric Micromachined Ultrasonic Transducers) are MEMS-based piezoelectric transducers (where MEMS is an acronym for Micro Electro-Mechanical Systems) that, unlike bulk piezoelectric transducers, rely on thickness-mode motion, that is take advantage of the flexural motion of a thin membrane coupled with a thin piezoelectric film.

In comparison with bulk transducers, PMUTs may exhibit:
  a narrower bandwidth;
  possible differences in the resonance frequencies of each individual membrane, due to manufacturing tolerances;
  variability ("wandering") of resonance frequency over-time; and
  non-linear effects (similar to the hardening/softening behavior of a spring) which may lead to saturation in sound pressure levels.

Consequently, certain advantages related to the use of PMUTs (such as small dimensions and low driving voltages) may be undesirably counterbalanced by the narrower bandwidth available (Q>70 in comparison with Q<10, for instance), sensitivity to manufacturing tolerances, resonance frequency wandering and variations in membrane stiffness. These aspects may militate against using conventional time-of-flight measurement methods such as cross-correlation methods.

While involving a certain amount of computation and calibration, cross-correlation methods may offer advantages of good accuracy, good sensitivity, adaptability to multi-target environments in comparison with simpler methods such as threshold-based methods which may be undesirably affected by disadvantages such as low accuracy, low sensitivity, noise vulnerability and availability of a single-target operation only.

Cross-correlation approaches are also adapted to see their accuracy increased by resorting to multi-frequency operation and may thus provide largely satisfactory results in a context where approaches such as a phase shift/sine fitting (which may be used to refine a raw measurements performed with other methods) and time-of-flight measurement with time-variant filtering (Kalman filtering, for instance) have also been considered.

BRIEF SUMMARY

One or more embodiments of the present disclosure contribute to further improving operation of electro-acoustic transducers by addressing certain issues such as variability over time of the echo shapes received and/or the fact that in certain transducers (such as PMUTs, for instance) the transducer membrane may have different and time-varying resonance frequencies, which may lead to situations where these are unable to "talk" to each other.

According to one or more embodiments, various improvements and advantages can be achieved by means of a method having the features set forth in the claims that follow.

One or more embodiments may relate to a corresponding device (an acoustic location sensor module being exemplary of such a device).

One or more embodiments may relate to a corresponding system.

Obstacle detection systems (for use in the automotive field, for instance), volume measurement systems, gesture recognition systems or flow metering systems are exemplary of such systems.

BRIEF DESCRIPTION OF THE SEVERAL VIEWS OF THE DRAWINGS

One or more embodiments will now be described, by way of example only, with reference to the annexed figures wherein:

FIG. 1 is a block diagram exemplary of a possible context of use of embodiments;

FIGS. 2, 3 and 4 are schematically exemplary of criteria which may be adopted in embodiments in order to identify certain parameters of an electro-acoustical transducer;

FIG. 16 is a collection of time diagrams related to possible acts in embodiments.

DETAILED DESCRIPTION

Figure 5:
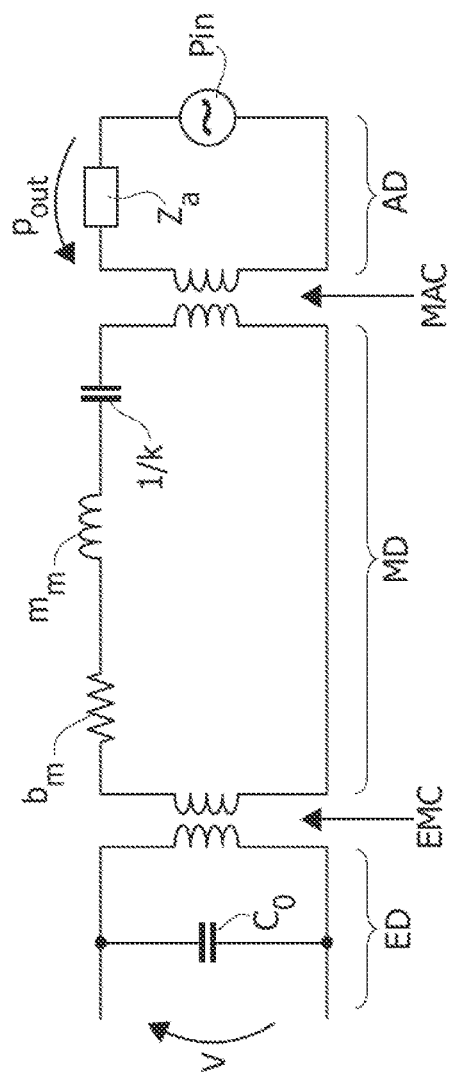
FIGS. 5, 6A and 6B are illustrative of a model applicable in embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

It will be otherwise appreciated that one or more embodiments apply to electro-acoustic transducers, that is components capable of acting as transducers between the electrical domain and the acoustical domain, by converting electrical signals into acoustic signals—and/or—converting acoustic signals into electrical signals; that is, the wording "electro-acoustic" is in no way to be construed, even indirectly, as limited to converting electrical signals into acoustic signals.

Also, the exemplary description provided in the following will refer for simplicity and ease of understanding to arrangements comprising both a "transmitter" section (TX), configured to convert electrical signals into an acoustic signals transmitted (towards an obstacle, for instance), and a "receiver" section (RX), configured to convert acoustical signals received (as reflected from an obstacle, for instance) into electrical signals.

However, the embodiments are not limited to such possible TX/RX arrangements and can be advantageously applied to arrangements including only a "transmitter" section (to controllably adjust the resonance frequency of a transducer therein, for instance) or only a "receiver" section (to generate a reference signal for cross-correlation with a signal received via a transducer therein, for instance).

Likewise, while the exemplary description provided in the following will refer for simplicity and ease of understanding to ultrasound transducers, one or more embodiments may apply, in general, to electro-acoustic transducers capable of acting as transducers between the electrical domain and the acoustical domain. In that respect, while PMUTs will be referred throughout for simplicity and ease of understanding, the embodiments can be advantageously applied to electro-acoustic transducers other than PMUTs where issues such as those discussed in the foregoing may arise.

Finally, while one or more embodiments may contemplate using distinct transducers for transmission (TX) and reception (RX), certain embodiments may contemplate a single transducer configured to operate both as a transmitter and a receiver (TX/RX).

The functional diagram of FIG. 1 refers by way of example to (ultra)sound based obstacle detection and ranging which may include (in a manner known to those of skill in the art) an electrical transmission signal TX applied to a transmission pulse generator 10 (a PMUT-based generator for instance) which is configured to emit corresponding acoustical pulses (ultrasound pulses) towards a surrounding space.

Sound as reflected (by an "obstacle", for instance, not visible in the figure) can be acquired at 20 so that, after possible envelope extraction (an optional act exemplified by a dashed block 30 in FIG. 1) cross-correlation can be performed in an act 40 with a reference signal such as a reference echo RE. Such a reference signal can be generated (as discussed in the following) in an act represented by block 50 with envelope extraction possibly applied (as represented at 60 in dashed line) to the reference echo RE.

As exemplified in FIG. 1, the outcome of cross-correlation (of the received signal and the reference signal RE) at 40 may produce a measurement signal MS to be used for a desired or selected application (obstacle detection and ranging, for instance).

A possible time behavior of such a reference signal RE is exemplified on the right-hand side of FIG. 1.

As noted, an arrangement as exemplified in FIG. 1 is conventional in the art, which makes it unnecessary to provide a more detailed description herein.

Also, as discussed previously, a possible TX/RX obstacle detection/ranging arrangement is just exemplary of a wide variety of possible applications (volume measurement, gesture recognition, flow metering, just to mention a few), which may possibly include only a "transmitter" section and/or only a "receiver" section.

As discussed in the foregoing, when ultra sound transducers such as PMUTs are used in such applications, the bandwidths of the transmitter (block 10 in FIG. 1) and the receiver (block 20 in FIG. 1) may not overlap, or overlap only partly, so that information on the reflected sound may hardly be present or even be absent in the signal acquired at 20.

Also, the frequency responses of the transducers may vary over time. This militates against determining (by means of one-time calibration, for instance) a time-invariant reference signal RE suited to provide a satisfactory result of cross-correlation (block 40 in FIG. 1).

One or more embodiments may be based on the recognition that the resonance frequency of a transducer as considered herein (and other parameters, such as parameters exemplary of the damping behavior of the vibrating part of the transducer, such as the membrane of a PMUT, for instance) can be identified as schematically exemplified in FIG. 2, namely by sensing the transducer response to (electrical) stimulation pulses (see TX pulses on the left-hand side of FIG. 2).

The damping ratio, the decay time constant or the Q-factor are exemplary of such "damping parameters" representative of the damping behavior of a transducer.

FIG. 2 is exemplary of the act of sensing the ring-down behavior of a transducer (namely how the pulses gradually "die-down" once the stimulation pulses are discontinued), as indicated on the right-hand side of FIG. 2.

As exemplified in FIG. 2, from the ring-down signal sensed on the transducer (transmitter and/or receiver)—which can be acquired as discussed in the following—(at least) two values can be extracted, namely the oscillation frequency $f_0$ and (as a parameter exemplary of the damping behavior of the transducer) the decay time constant $\tau$.

Indeed, based on general principles of physics applying to an oscillatory (vibratory) system, applying to such an electro-acoustical transducer a train of (electrical) excitation pulses (TX pulses) over an excitation interval gives rise—once excitation is discontinued, that is after the end of the excitation interval—to a ring-down behavior so that an (electrical) ring-down signal (Ring-down) can be acquired at the transducer which can be expressed as a function of time $t$ as $$y = \sin(2\pi f_0 + \varphi) e^{-t/\tau}$$

with an envelope which can be expressed as $$y = e^{-t/\tau}$$

where $f_0$ and $\tau$ are the resonance frequency and the decay time constant of the system and $\varphi$ an arbitrary phase.

While the decay time constant τ will be hereinafter referred to for simplicity, those of skill in the art will easily appreciate that the embodiments are in no way limited to the choice of any specific damping parameter.

As noted, other than the decay time constant τ, the damping ratio or the Q-factor (or any other parameter associated/derivable from these) representative of how the amplitude of the oscillation reduces over time during ringdown, eventually going to zero, can be used in embodiments.

FIG. 4 is exemplary of the possibility of providing an "electrical" representation of an oscillating system.

As discussed in the following such an electrical representation may take the form of a BVD model (Butterworth-Van Dyke model) to which the following relationships may apply:

$$f_0 = (1/2\pi)(L/[C_0 C/(C_0+C)])^{1/2}$$

$$\tau = 2(L/R)$$

Having two equations and four unknowns, namely the BVD model parameters L, R, C, $C_0$, such a system does not admit a univocal solution. However in the present context (PMUTs, for instance), the (judicious) assumption can be made that $C_0$ is much larger than C (so that a constant value can be used for $C_0$) and that a constant value can be used for L (electrical equivalent of lumped mass). Two of the unknowns can thus be removed and the system solved.

Just by way of background, the Butterworth-Van Dyke model (also known as a "Mason" or "KLM" model) is an electrical equivalent circuit of an electro-acoustical transducer comprising, as schematically represented in FIG. 5, an electrical domain ED coupled, via an electrical-mechanical coupling EMC, a mechanical domain MD (notionally having plural normal modes: only the first one is represented in FIG. 5 for simplicity). The mechanical domain MD is in turn coupled, via a mechanical-acoustic coupling MAC, to an acoustic domain AD. Being an electrical equivalent circuit, the electrical domain ED can be represented as a capacitor Co across a first (primary, for instance) winding of a first transformer modeling the electrical-mechanical coupling EMC, with an (electrical) signal V applied across the capacitor Co and the winding of the transformer. Those familiar with the BVD model will appreciate that V may be a generator (that is, an input, as may be the case of ES in FIG. 6A) or a measuring unit (that is, an output as may be the case of SM in FIG. 6B).

As represented in FIG. 5, the mechanical domain MD comprises the other (secondary, for instance) winding of the transformer which models the electrical-mechanical coupling EMC and a first (primary, for instance) winding of a (second) transformer modeling the mechanical-acoustic coupling MAC coupled in a loop including the series connection of a resistor $b_m$ modeling internal losses, an inductor $m_m$ modeling the (vibrating) mass (a membrane, for instance) and a capacitor modeling the stiffness 1/k thereof.

As represented in FIG. 5, the acoustic domain AD comprises the other (secondary, for instance) winding of the transformer which models the electrical-mechanical coupling EMC included in a loop together with a generator which models the sound pressure level $p_{in}$ possibly incident onto the transducer and an impedance $Z_a$ which models the (air) acoustic impedance.

The Butterworth-Van Dyke/Mason/KLM is otherwise known to those of skill in the art, which makes it unnecessary to provide a more detailed description herein.

Figure 6B:
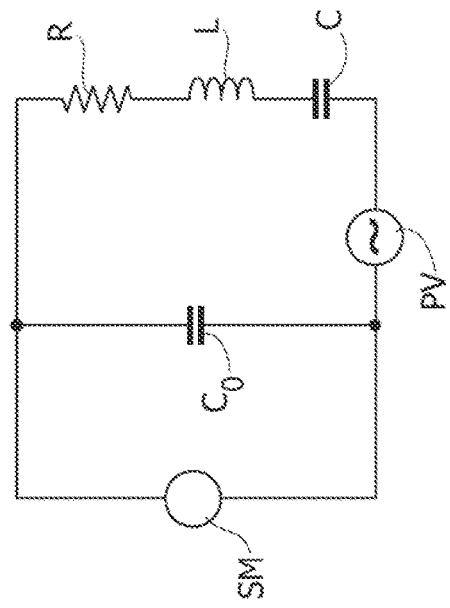
Figure 6A:
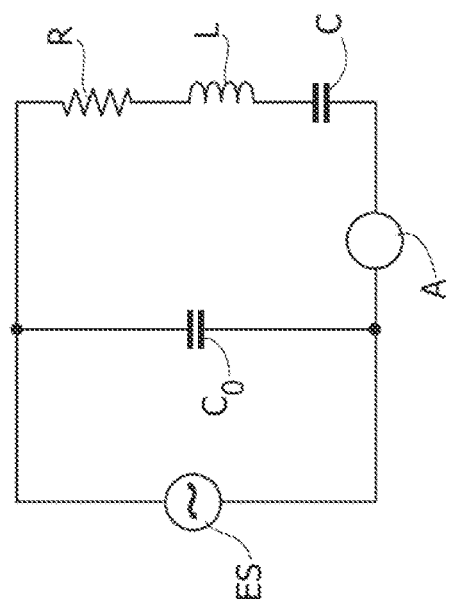

It is noted that considering the impedance at the input port, the model can be simplified by removing the transformers EMC, MAC, which results in simplified models for a transmitter transducer (electric to acoustic) and for a receiver transducer (acoustic to electric) as represented in FIG. 6A and FIG. 6B, respectively, where parts or elements like parts or elements already discussed in connections with the previous figures are indicated by like reference symbols.

In the transmitter model of FIG. 6A, ES represents an (electrical) excitation signal (TX in FIG. 1, for instance) applied to a transmitter transducer (10 in FIG. 1, for instance) which results in a current A indicative of (proportional to) the (ultra)sound pressure level generated by the transducer.

In the receiver model of FIG. 6B, PV represents a voltage indicative of (proportional to) the incident (ultra)sound pressure level (as received at 20 in FIG. 1, for instance) and SM denotes a measured (voltage) signal.

In one or more embodiments, the ability of identifying the resonance frequency of an electro-acoustical transducer may be exploited in order to obtain that a certain transducer may operate at a desired or selected resonance frequency.

As discussed previously, a transducer membrane possibly having different and time-varying resonance frequencies, for instance at a transmitter (block 10 in FIG. 1) and at a receiver (block 20 in FIG. 1) may adversely affect operation of a related arrangement, by possibly making is unsatisfactory, if not hardly possible.

Figure 7:
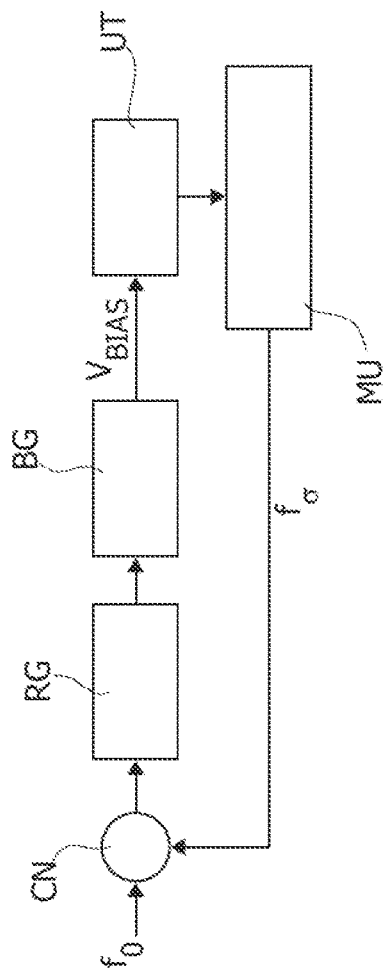
FIGS. 7, 8A and 8B are illustrative of possible exploitation of such a model in embodiments.

In one or more embodiments, the ability to identify the resonance frequency of an electro-acoustical transducer may be exploited as schematically exemplified in FIG. 7, that is by exploiting the dependency of a piezo-electric layer stiffness (and thus the resonant behavior of the associate transducer) on a (DC) bias voltage $V_{BIAS}$ applied to the transducer UT.

In one or more embodiments as exemplified in FIG. 7 this may occur via a bias generator BG controlled by a regulator RG configured to selectively vary the resonance frequency of the transducer UT as a function of the offset (difference) calculated at a comparison node CN between a reference frequency $f_0$ (corresponding to a desired or selected resonance frequency, for instance) and an actual resonance frequency $f_{\tilde{0}}$ as measured on the transducer UT via a measurement unit MU.

As exemplified herein, the measurement unit MU can be configured to measure the actual resonance frequency $f_{\tilde{0}}$ with a view to bringing the resonance frequency of the electro-acoustical transducer (UT) to a reference frequency value (for instance as discussed in connection with FIG. 7, for instance, that is by controlling a bias voltage $V_{BIAS}$ of the electro-acoustical transducer as a function of the resonance frequency).

In one or more embodiments this may occur irrespective of the possible use of a BVD model (e.g., to synthesize a reference echo RE).

For instance, the measurement unit MU can be configured to perform a fitting of the function $y = \sin(2\pi f_0 + \varphi) e^{-t/\tau}$ on the data measured as exemplified in FIG. 3.

This fact (that is, the control loop of FIG. 7 being suited to be implemented irrespective of the possible use of a BVD model to synthesize a reference signal such as RE) can be further appreciated by noting that the BVD model is referred to in FIG. 12 (to be discussed in the following) without being mentioned in FIG. 11: in fact the procedure in FIG. 12 relies on the fact that $f_0 e \tau$ have been already identified (as an output from the block di 206), so that the parameters of the BVD model (namely $C_0$, C, R, L) can be calculated.

A (closed loop) control system as exemplified in FIG. 7 may thus be configured to operate, in a manner known to those of skill in the art, in order to facilitate having $f_6 = _0$ so that the transducer UT may operate at a desired or selected resonance frequency.

Figure 8B:
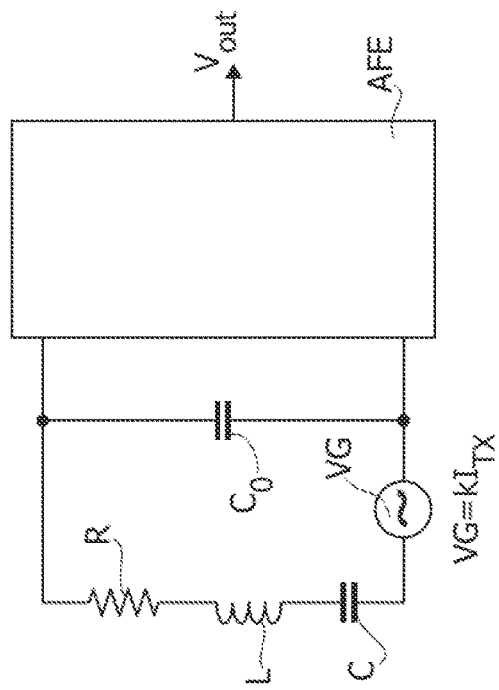
Figure 8A:
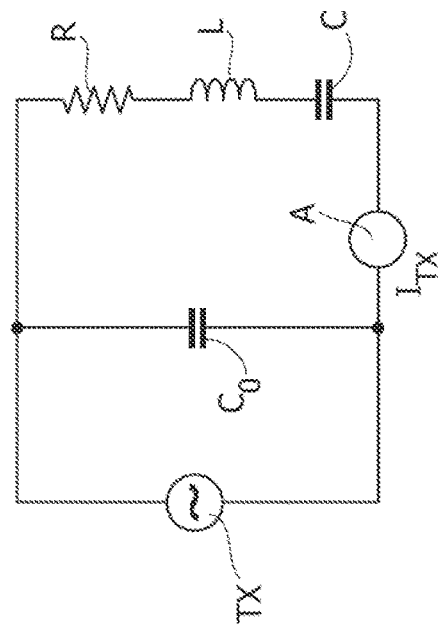

As an alternative or in addition to obtaining a desired or selected resonance frequency, the ability of identifying the resonance frequency (and other operation parameters such as damping parameters like the decay time constant τ, for instance) may be exploited as schematically represented in FIGS. 8A and 8B (substantially similar to FIGS. 6A and 6B, but here considered in possible combination) in order to generate—in real time—a desired or expected shape for a reference signal RE (a reference echo as exemplified in FIG. 1, for instance).

FIGS. 8A and 8B are exemplary of a case applicable to an arrangement as exemplified in FIG. 1 where, once the BVD model parameters are known (for the transmitter at 10 and for the receiver at 20) an expected echo shape RE can be calculated, for instance with numerical integration.

For instance, as a function of a (known) excitation signal TX (see also FIG. 1), based on the knowledge of the parameters of the BVD model ($C_O$, R, L, C—see FIG. 6A or 8A, for instance) the expected waveform of the (ultra)sound signal generated by the transmitter transducer can be calculated, as modeled by the current $I_{TX}$ of the current generator A of FIG. 8A.

This will permit to determine the expected waveform of the (ultra)sound signal received at the receiver 20, for instance due to reflection against an obstacle.

The expected waveform of the (ultra)sound signal received at the receiver 20, may then be applied as $V=kI_{TX}$ to the (current controlled) voltage generator VG of FIG. 8B, so that an expected echo waveform can be computed as a (normalized) output voltage $V_{out}$ from the analog front end AFE of the receiver. Here again, the receiver transducer can be represented as a BVD model with k being able to be whatever insofar as the output $V_{out}$ is normalized.

Taking into account the analog front end AFE is helpful insofar as the analog front end (a trans-impedance amplifier with a low-pass filter can be considered as a non-limiting example) may have an impact on the output waveform.

Figure 15:
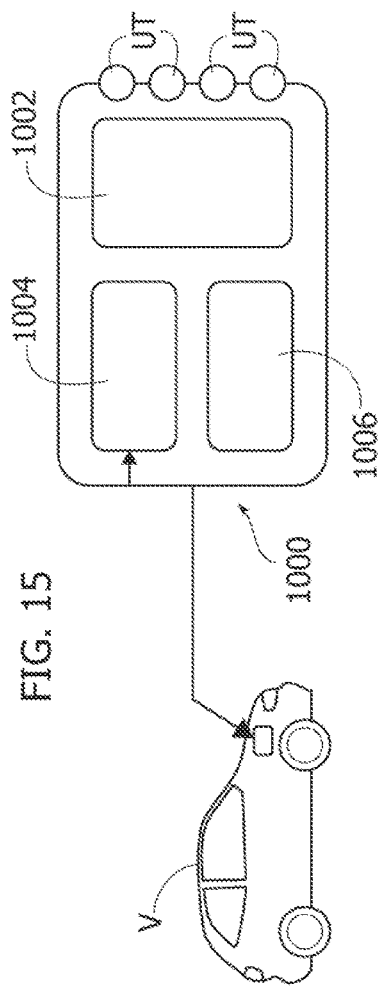
FIG. 15 is exemplary of a system operable according to embodiments.

To sum up:

FIG. 8A is exemplary of the possibility of relying on a BVD model (see FIG. 6A) to calculate—in a manner known to those of skill in the art, based on elementary filter theory, with calculations suited to be performed on-the-fly in a processing unit such as 1004 in FIG. 15—a transfer function/impulse response linking $I_{TX}$ to the signal TX; and FIG. 8B is exemplary of the possibility of relying again on BVD model (see FIG. 6B) to calculate—based on elementary filter theory, with calculations suited to be performed on-the-fly in a processing unit such as 1004 in FIG. 15) a transfer function/impulse response linking $V_{out}$ (thus possibly taking into account the effect of the analog front end AFE) to VG, namely $VG=kI_{TX}$.

Considering FIGS. 8A and 8B in combination, under the judicious assumption that an (ultra)sound signal transmitted from a transducer as modeled in FIG. 8A is received (after reflection at an obstacle, for instance) from a transducer as modeled in FIG. 8B, the possibility will exist of calculating a transfer function/impulse response linking $V_{out}$ to the signal TX thus "synthesizing" (based on the waveform of the signal TX: square wave, chirp, and so on) a reference signal such as a reference echo RE for use in cross-correlation (matched filtering) at 40 in FIG. 1.

As noted, such synthesis may involve calculations (essentially, numerical integration of the BVD model based on principles known to those of skill in the art) suited to be performed on-the-fly (that is in real time) in a processing unit such as 1004 in FIG. 15.

Figure 9:
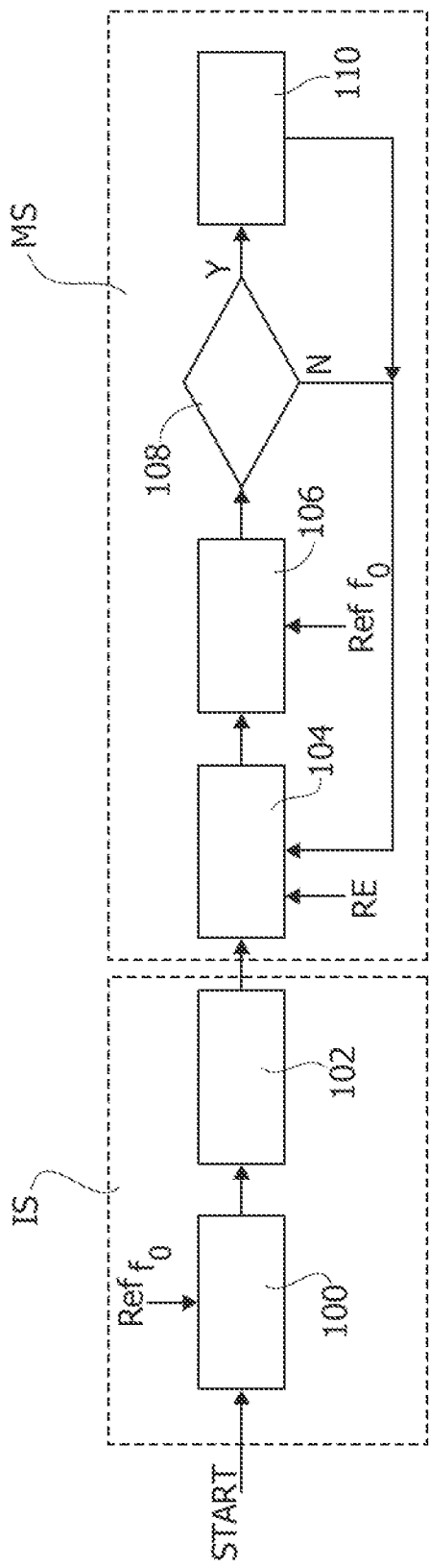
FIG. 9 is a flow chart exemplary of possible acts in embodiments.

The flowchart of FIG. 9 is exemplary of a possible operation of embodiments as exemplified in the following.

In that respect it will be appreciated that a system according to embodiments as exemplified in FIG. 15 (to be discussed in the following) may include both a hardware and a software components.

For instance, an acoustic location sensor module 1000, possibly configured to be mounted on a motor vehicle such as a motor car V as exemplified in FIG. 15, may comprise an analog front-end 1002 coupled to one or more transducers UT (PMUTs being exemplary of such transducers) as well as a software component 1004 running on a processing circuit such as a microcontroller unit (MCU) with the peripherals of the processing unit possibly included, at least partly, in the hardware architecture at 1002.

It will be otherwise understood that a microcontroller is just one example of one of a variety of processing units which may be used in embodiments.

In one or more embodiments the analog front end 1002 and the processing unit 1004 can be powered via a power management circuit 1006 as desired.

In one or more embodiments as exemplified in FIG. 9, operation of an arrangement as discussed herein may comprise an initial setup face IS in turn comprising, after the system is activated (START), a (first) frequency tuning block 100 which may be repeated (for each transducer UT) until convergence is achieved at a reference frequency $f_o$ with an update of the reference echo block 102 repeated for each transmitter/receiver pair.

Once the initial setup 100, 102 (IS) completed, a measurement sequence MS is then started which, in one or more embodiments, may comprise a measuring block 104 which can be repeated notionally N times as a function of a reference echo RE followed by a sequence of acts 106, 108, 110.

In such a sequence, block 106 is exemplary of an act of frequency tuning as a function of frequency $f_o$ followed by a check as represented in the block 108 as to whether the resonance frequency (and possibly other parameters such as damping parameters like the decay time constant) have changed over time.

A negative outcome (N) of block 108 (no changes detected) leads back to the measuring block 104.

Conversely, a positive outcome (Y) of the check of block 108 leads to an update reference echo block 110 being performed as exemplified by at 110 before operation returns to the measuring block 104, with the sequence as exemplified by blocks 106, 108, 110 repeated for each transducer UT (see FIG. 15).

Figure 10:
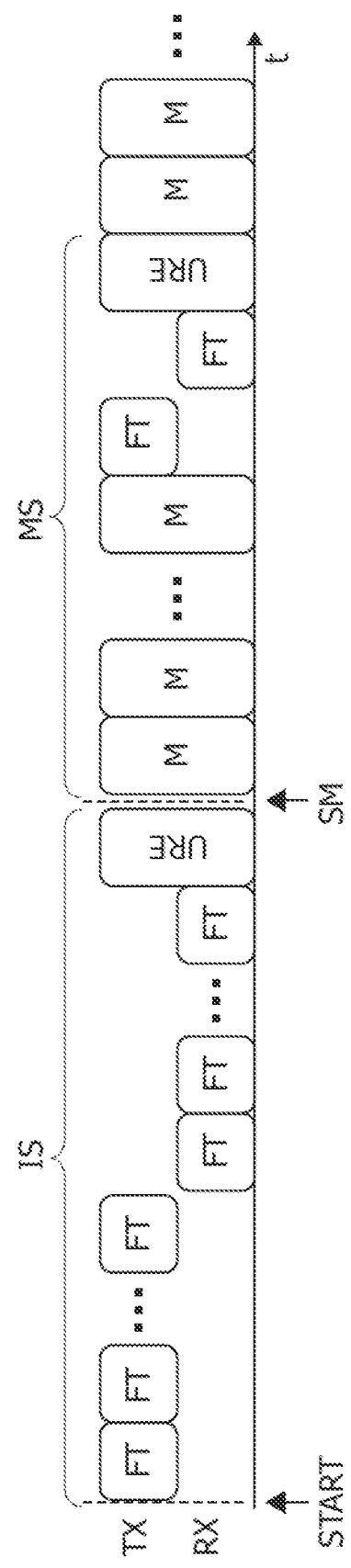
FIG. 10 is a temporal sequence corresponding to the flowchart of FIG. 9.

FIG. 10 is exemplary of a possible time sequence of performing the various acts as represented in FIG. 9.

FIG. 10 highlights the possibility for certain acts to be performed simultaneously (or at least concurrently) for a transmitter TX and a receiver RX.

In the time sequence of FIG. 10:
FT denotes frequency tuning blocks such as 100 (initial setup) and 106 (measuring sequence);
URE denotes an update reference echo act in blocks such as 102 (initial setup) and 110 (measuring sequence); and
M denotes a measuring block (104 in FIG. 9).

Figure 11:
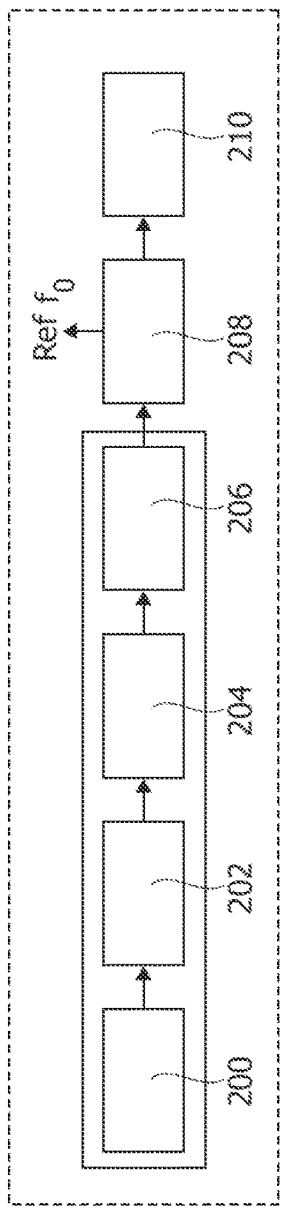
FIGS. 11, 12 and 13 provide additional details of certain acts as exemplified in FIG. 9.

The flowchart of FIG. 11 is exemplary of certain possible details of implementation of frequency tuning as exemplified by blocks 100 and 106 in FIG. 9.

In FIG. 11, after a setup act exemplified by block 200, block 202 is exemplary of a pulse excitation of a transducer (see, for instance the left-hand side of FIG. 2) followed by ring-down acquisition 204 (right-hand side of FIG. 2) for the excited sensor.

The results of ring-down acquisition can thus be exploited (as discussed previously) for identifying transducer parameters such as the resonance frequency and $\tau$.

For instance, the outcome of parameter identification as exemplified by block 206 in FIG. 11 may be regarded as corresponding as $f_G$ as exemplified in FIG. 7 with a corresponding update regulation act 208 (see the blocks CN, RG and BG FIG. 7) and an update of bias generator in an act 210 (block BG in FIG. 7).

In one or more embodiments, processing as exemplified by CN and RG in FIG. 7 may be software-based (see 1004 in FIG. 15). In one or more embodiments, processing as exemplified by MU may be a mix of hardware and software (see both 1002 and 1004 in FIG. 15).

Figure 12:
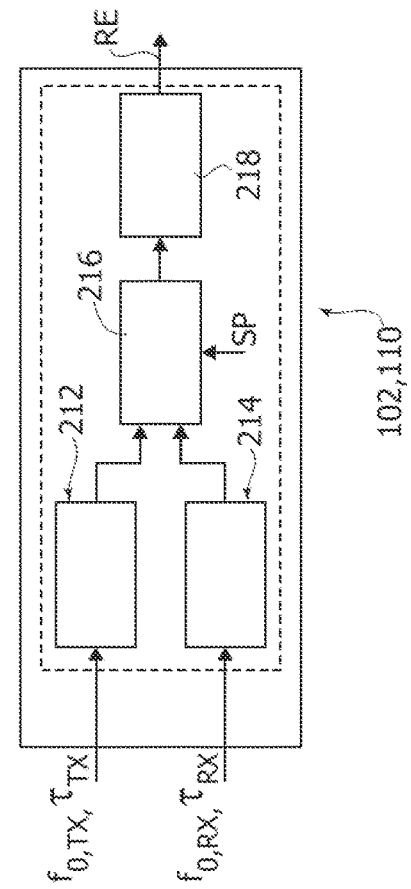

FIG. 12 is exemplary of possible embodiments of the update reference echo blocks (102, 110 in FIG. 9).

In FIG. 12, blocks 212 and 214 are exemplary of acts for determining a BVD model for a transmitter transducer (block 212) and a receiver transducer (block 214) starting from reference parameters $F_{0,TX}$, $\tau_{TX}$ (and $F_{0,RX}$, $\tau_{Rx}$ for a transmitter transducer and a receiver transducer, respectively.

Block 216 is exemplary of an act of reference echo-synthesis starting from the outcome from blocks 212, 214 and (general) systems parameters SP as discussed.

Block 218 in FIG. 12 is exemplary of an act of updating the reference echo RE (right-hand side of FIG. 1) based on the outcome of the synthesis act of block 216. It will be appreciated that, while represented separately for clarity, block 218 (the update of block 50 in FIG. 1) can be regarded as included in block 216, providing RE as an (updated) output.

Figure 13:
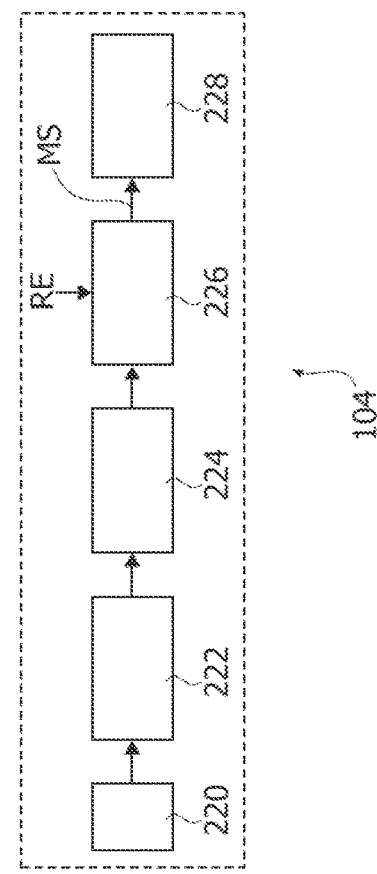

FIG. 13 is another flow chart exemplary of a possible implementation of the act of measuring as exemplified by the block 104 in FIG. 9.

In FIG. 13, reference 220 denotes a setup act followed by an act 222 of exciting a TX transducer UT with pulses (TX only, when a TOF measurement is involved).

Block 224 in FIG. 13 is exemplary of an act of acquiring an echo received from an "obstacle" (or target) as exemplified by block 20 in FIG. 1.

Block 226 in FIG. 13 is exemplary of cross correlation of the signal acquired with the reference echo RE (see again block 40 in FIG. 1 for general reference) to produce the measurement signal MS which may be exploited (for distance calculation to the obstacle or target, for instance) in an act exemplified by block 228.

Repeated reference to FIG. 1 in describing FIG. 13 highlights the fact that the related acts exemplified in FIG. 13 may be performed in any way and by any means known to those of skill in the art, thus making it unnecessary to provide a more detailed description herein: in fact, one or more embodiments primarily focus on the acts of a real-time synthesizing the reference echo RE and/or countering undesired variation of transducer parameters.

Figure 14A:
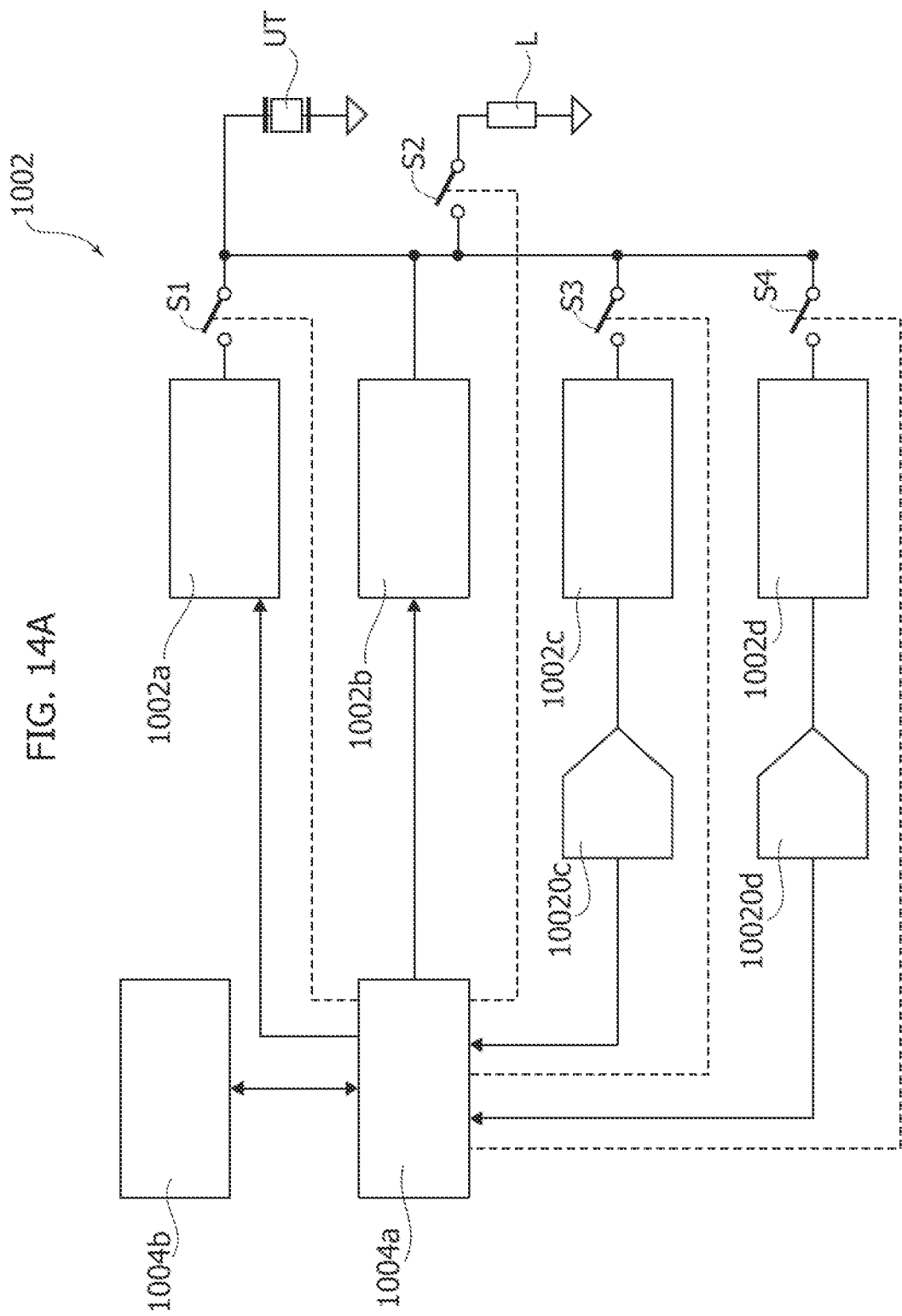
FIGS. 14A, 14B and 14C are exemplary of possible hardware architectures for use in embodiments.
Figure 14B:
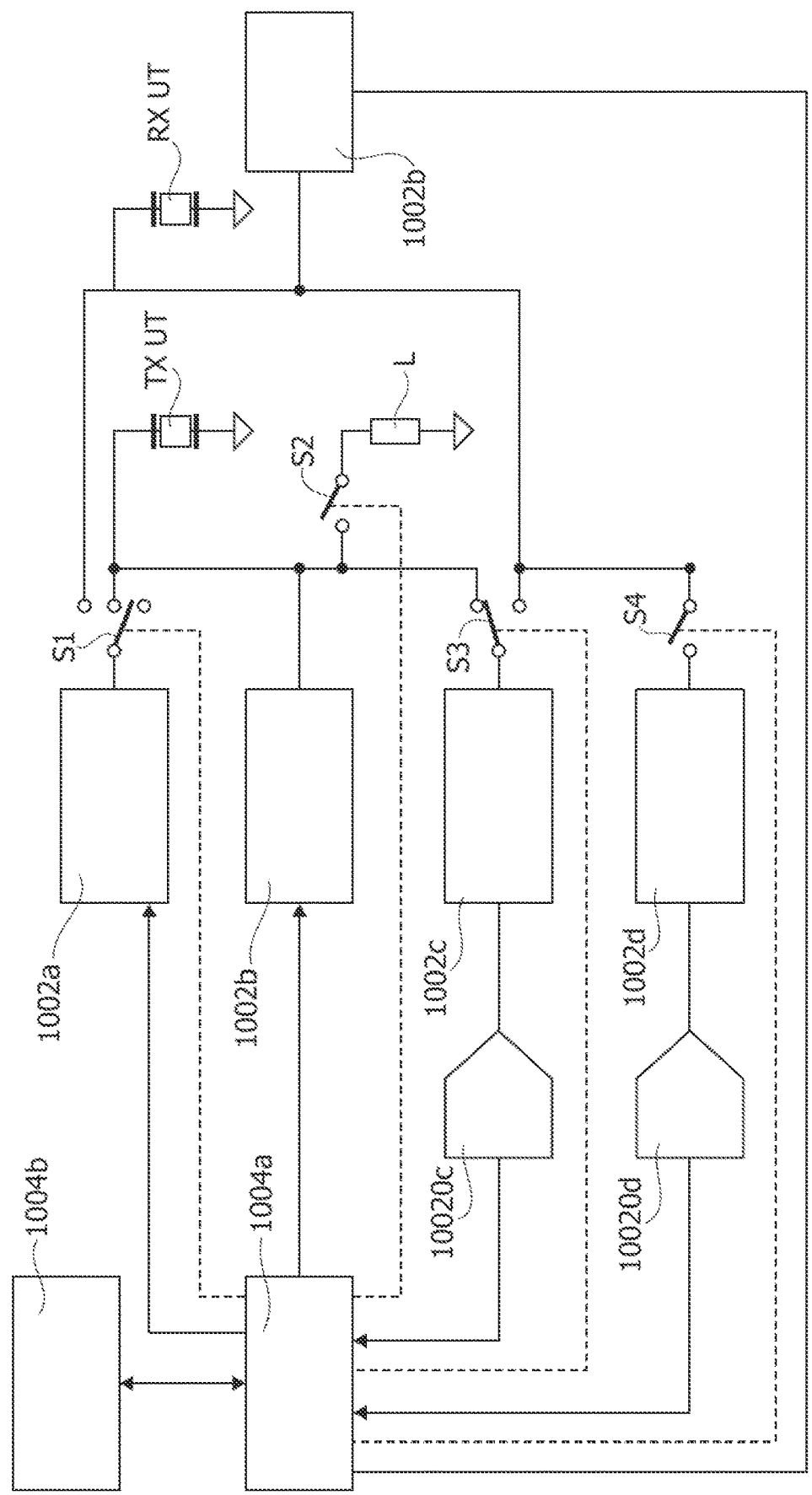
Figure 14C:
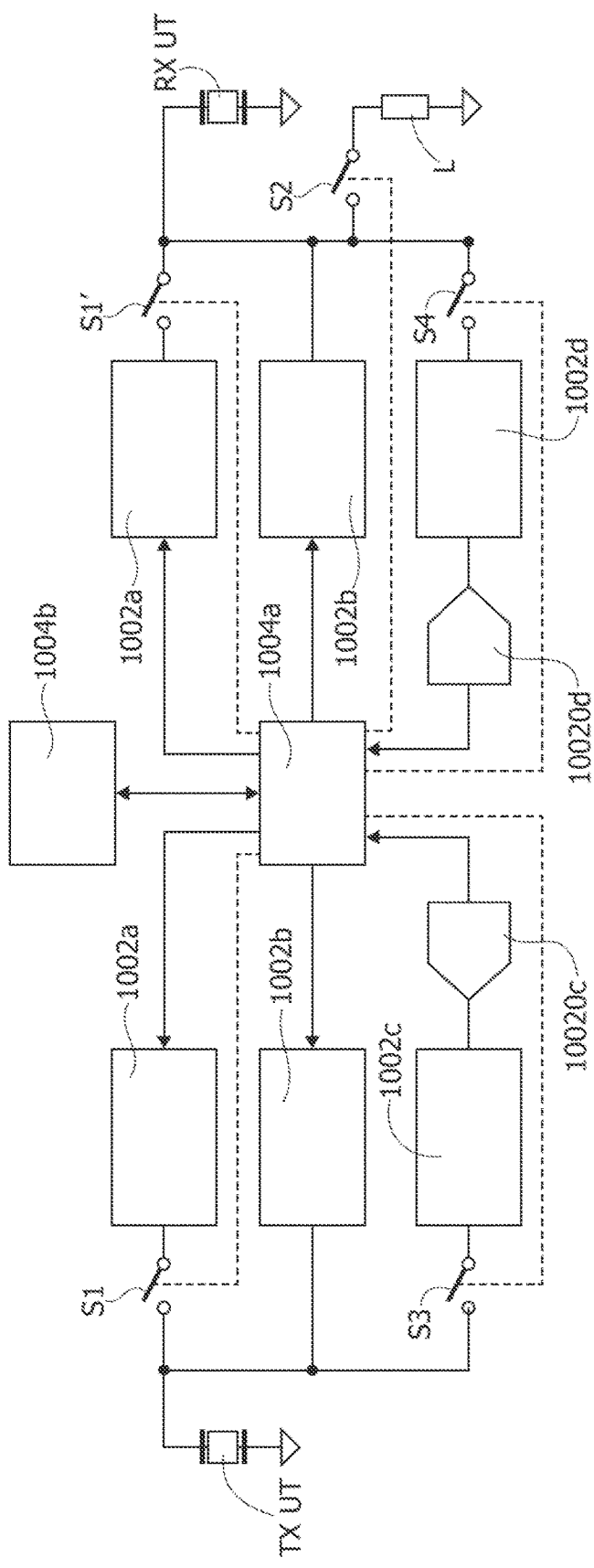

FIGS. 14A, 14B and 14C are exemplary of possible architectures which may be adopted for ring-down acquisition while also providing DC bias adjustment of the transducer UT along the lines of FIG. 7, both of these actions being adapted to be performed simultaneously or concurrently with acquisition of the received signal (block 20 in FIG. 1 and block 224 in FIG. 13).

The diagram of FIG. 14A refers to a hardware architecture intended for use with a single transducer UT (and intended to be replicated for every transducer in a system), while the diagrams of FIGS. 14B and 14C refer to hardware architecture intended for use with plural transducers, a transmitter transducer TX UT and a receiver transducer RX UT, for instance.

Unless indicated differently, like parts or elements in FIGS. 14A, 14B and 14C are indicated by like reference symbols so that distinct descriptions of FIGS. 14A, 14B and 14C will not be repeated for brevity.

In FIGS. 14A, 14B and 14C, references 1004a and 1004b denote a controller circuit and a memory circuit which, in one or more embodiments, may be included and/or associated with the processing unit (MCU, for instance) 1004 in FIG. 15.

Similarly, the elements exemplified by blocks 1002a to 1002d as well as by blocks 10020c, 10020d are exemplary of circuitry adapted to be included in the analogue portion 1002 exemplified in FIG. 15.

In FIGS. 14A, 14B and 14C reference 1002a denotes AC voltage generators (for instance pulse generator of the AC-coupled type) adapted to apply electric pulses to the transducer(s) UT or TX UT, RX UT both for transmission pulse generation (see block 10 in FIG. 1 or block 222 in FIG. 13) when coupled to the transducer(s) via switches such as S1 (and S1' in FIG. 14C).

In the case of the arrangement exemplified in FIG. 14B, the switch S1 may be a multi-position switch configured to couple a single generator 1002a to a selected one of the transducers TX UT and RX UT.

In one or more embodiments as exemplified herein, both the generator(s) 1002a and the switch(es) S1, S1' are configured to operate under the control of the controller 1004a.

Reference 1002b in FIGS. 14A, 14B and 14C denote DC voltage generators (DC coupled) configured to apply to the transducer(s) UT or TX UT, RX UT DC bias such as, for instance the (control) bias voltage $V_{BIAS}$ of FIG. 7.

In FIGS. 14A, 14B and 14C reference 1002c denotes an amplifier/buffer adapted to be coupled to the transducer UT (or a respective one of the transducers TX UT, RX UT) via a switch S3 operating under the control of the controller 1004a.

Reference 10020c denotes an analogue-to-digital converter (ADC) configured to convert to the digital domain a signal as produced by the amplifier 1002c during ring-down acquisition (see the right-hand side of FIG. 2) and block 204 in FIG. 11.

Reference 1002d denotes another amplifier (a trans-impedance amplifier, for instance) configured to be selectively coupled to the transducer UT or RX UT during acquisition of the received signal (see block 20 in FIG. 1 and block 224 in FIG. 13).

Reference 10020d denotes an analogue-to-digital converter (ADC) configured to convert to the digital domain a signal as produced by the amplifier 1002d (which is configured to be coupled to the transducer(s) UT (FIG. 14A) or RX UT (FIG. 14B and 14C) via a switch S4 controlled by the controller 1004a.

Finally, reference L in FIGS. 14A, 14B and 14C denotes an (optional) clamp load configured to be coupled to the transmitter transducer(s) via a switch S2 controlled by the controller 1004a during measurement in order to facilitate quick dampening of transducer oscillations. The value for L may be selected as an impedance value which facilitates transfer of energy from the transducer to the load L. For instance L may be a resistor with a value equal to the modulus of the impedance for $C_0$ in FIG. 8A.

In comparison with the arrangement of FIG. 14A (intended to be replicated for every transducer in a system), the arrangement of FIG. 14B may be advantageous insofar as it facilitates reducing amplifier and generator replication.

Also, the arrangement of FIG. 14C may be advantageous insofar as it facilitates using the trans-impedance amplifier 1002d both for RX acquisition and for ring-down acquisition.

The following Table is exemplary of possible criteria which may be adopted in the controller 1004a (configured to be programmed for that purpose in a manner known to those of skill in the art) to control the switches S1 to S4 in possible embodiments.

In the following table, "closed" denotes a switch (S1 to S4) made electrically-conductive while "open" denotes a switch which is brought to a non-conductive condition.

|  | S1 | S2 | S3 | S4 |
| --- | --- | --- | --- | --- |
| Excitation | Closed | Open | Open | Open |
| TX clamp | Open | Closed | Open | Open |
| Ring-down acquisition | Open | Open | Closed | Open |
| RX acquisition | Open | Open | Open | Closed |

The table above refers explicitly to the arrangement of FIG. 14A, which is a more general architecture, adapted to be replicated for every transducer UT in a system.

It will be appreciated that arrangements as exemplified in FIGS. 14A, 14B and 14C involve a DC bias (that is 1002b) always connected.

It will be similarly appreciated that, in one or more embodiments, the switches shown may not be actual, "physical" switches (MOSFET transistors, for instance). In one or more embodiments, the switches shown may be implemented with series impedances, for instance.

Such a table can be easily extended to the multi-transducer arrangements of FIGS. 14B and 14C by taking into account that, in the case of switches such as S1 in FIG. 14B "closed" refers to the coupling action of the switch being intended to apply to individual transducer TX UT, RX UT for which a corresponding act is being performed.

As discussed previously, FIG. 15 is exemplary of a circuit/system architecture configured to host (at 1004, for instance) a software procedure capable of performing time-of-flight measurements by means of one or more ultrasonic transducers UT by taking into account (and countering) possible drawbacks related to narrow bandwidth available and/or transducer parameters possibly subject to manufacturing spread and variations over time. This may occur by means of a hardware architecture 1002 suited to connect one or more transducers UT to a DC voltage generator 1002b and (simultaneously) to either one of AC voltage generator (1002a), a trans-impedance amplifier (1002d), an amplifier/buffer (1002c) and a clamp load (L) by avoiding undesired mutually interference.

A possible mode of operation along the lines discussed in the foregoing is exemplified in FIG. 16.

FIG. 16 is an exemplary representation against a common time scale t of transmitter identification TX ID, receiver identification RX ID and measurement MS phases with exemplary representation of activation of:

RX ADC and TX ADC; and receiver and transmitter transducers RX/UT and TX/UT, with ring down and echo generation expressly indicated.

One or more embodiments may facilitate real-time identification of transducer parameters (for instance the resonance frequency and a damping parameter such as the damping ratio).

One or more embodiments may provide for the presence of a control loop to set the resonance frequency a desired or selected value by acting on the transducer DC bias.

Also, in one or more embodiments a model-based real-time synthesis of an expected shape of a reference echo may be facilitated without giving rise to undesired circuit complexity thus taking full advantage of features exhibit by ultrasound transducers such as PMUTs.

As exemplified herein, a method of operating an electro-acoustical transducer (for instance, UT) may comprise:

applying (for instance, 202; 1002a) to the transducer an excitation signal (for instance, TX pulses) over an excitation interval;

acquiring (for instance, 1002c, 10020c; 1002d, 10020d) at the transducer a ring-down signal (for instance, Ring-down) indicative of the ring-down behavior of the transducer after the end of the excitation interval; and calculating (for instance, 206), as a function of said ring-down signal, a resonance frequency (for instance, fo) of the electro-acoustical transducer.

A method as exemplified herein may comprise controlling (see for instance, CN, RG, BG in FIG. 7) a bias voltage (for instance, $V_{BIAS}$) of the electro-acoustical transducer as a function of the resonance frequency calculated to bring the resonance frequency of the electro-acoustical transducer to a reference frequency value, In combination with or as an alternative to (and/or) the foregoing, a method as exemplified herein may comprise transducing (with a same transducer or with a different transducer: see, for instance, 20, 224, 1002d, 10020d) an acoustical signal received into an electrical reception signal; calculating (for instance, 206), as a function of said ring-down signal, (at least one) damping parameter (for instance, τ) of the electro-acoustical transducer, and synthesizing, as a function of the resonance frequency ($f_0$) and the damping parameter (τ) of the electro-acoustical transducer (UT) calculated, a cross-correlation reference signal (for instance, a reference echo RE); and performing cross-correlation (for instance, 40, 226) of the electrical reception signal and the cross-correlation reference signal (RE).

As exemplified herein, the damping ratio, the decay time constant or the Q-factor are exemplary of damping parameters which may be used in embodiments. More generally, other than the decay time constant τ, the damping ratio or the Q-factor (or any other parameter associated/derivable from these), any other parameter representative of how the amplitude of the oscillation reduces over time (that is, undergoes damping) during ring-down, eventually going to zero, can be used in embodiments.

A method as exemplified herein may comprise transducing (for instance, 20, 224, 1002d, 10020d) said acoustical signal received into an electrical reception signal while acquiring said ring-down signal.

A method as exemplified herein, may comprise calculating as a function of said resonance frequency and said damping parameter a Butterworth-Van Dyke model (also known as a Mason or KLM model) of the electro-acoustical transducer, wherein said Butterworth-Van Dyke model comprises a simplified Butterworth-Van Dyke model with an electrical domain (for instance, ED), an acoustical domain (for instance, AD) and a mechanical domain (for instance, MD) between the electrical domain and the acoustical domain, wherein said simplified Butterworth-Van Dyke model:
comprises an electrical domain of the model having a constant capacitance $C_0$ and a mechanical domain of the model having an constant inductance L; and p1 is exempt from mutual inductances (for instance, EMC, MAC) coupling the electrical domain of the model with the mechanical domain of the model and coupling the mechanical domain of the model with the acoustic domain of the model.

A method as exemplified herein may comprise calculating said Butterworth-Van Dyke model of the electro-acoustical transducer as a function of a damping parameter ($\tau$) of the electro-acoustical transducer (UT) as $$\tau = 2(L/R)$$

wherein:
L is said constant capacitance of the mechanical domain of the model; and
R is the resistance representative of the transducer internal losses in the mechanical domain of the model.

A method as exemplified herein may comprise:
applying (for instance, 222; 1002a) an electrical transmission signal to a transmitter electro-acoustical transducer (for instance, UT TX), wherein the electrical transmission signal is transduced into an acoustical transmission signal transmitted by the transmitter electro-acoustical transducer; and
receiving (for instance, 224; 1002d, 10020d) at a receiver electro-acoustical transducer (for instance, UT RX) an acoustical signal resulting from reflection of said acoustical transmission signal, wherein the acoustical signal received is transduced by the receiver electro-acoustical transducer into an electrical reception signal, wherein the method comprises:
applying (for instance, 202; 1002a) both to the transmitter electro-acoustical transducer and to the receiver electro-acoustical transducer, respective trains of excitation pulses over an excitation interval;
acquiring (for instance, 1002c, 10020c; 1002d, 10020d) at both the transmitter electro-acoustical transducer and the receiver electro-acoustical transducer, respective ring-down signals indicative of the ring-down behavior of the transducer after the end of the excitation interval;
calculating, as a function of said respective ring-down signals, a resonance frequency (for instance, $f_{0,TX}$, $f_{0,RX}$) and a damping parameter (for instance, $\tau_{TX}$, $\tau_{RX}$) of both the transmitter electro-acoustical transducer and the receiver electro-acoustical transducer;
synthesizing (for instance, 212, 214, 216) said cross-correlation reference signal, as a function of the resonance frequency and the damping parameter of both the transmitter electro-acoustical transducer and receiver electro-acoustical transducer; and
performing cross-correlation (for instance, 40, 226) of the electrical reception signal and the cross-correlation reference signal (RE).

A method as exemplified herein may comprise:
applying said electrical transmission signal to a said simplified Butterworth-Van Dyke model for the electro-acoustical transmitter transducer to produce a current signal (for instance, $I_{TX}$) representative of an acoustical transmission signal transmitted by the transmitter electro-acoustical transducer; and applying a voltage signal (for instance, VG=k. $I_{TX}$) which is a function of said current signal to a said simplified Butterworth-Van Dyke model for an electro-acoustical receiver transducer to produce an output signal (for instance, $V_{out}$) representative of the electrical reception signal at the electro-acoustical receiver transducer.

A method as exemplified herein may comprise coupling to said simplified Butterworth-Van Dyke model for an electro-acoustical receiver transducer a filtering function representative of the transfer function of an analog front end (for instance, AFE) coupled to said electro-acoustical receiver transducer, wherein said output signal representative of an electrical signal produced by said electro-acoustical receiver transducer is affected by said transfer function of an analog front end coupled to said electro-acoustical receiver transducer.

In a method as exemplified herein, the electro-acoustical transducer may comprise an ultrasound electro-acoustical transducer, optionally a PMUT.

A circuit as exemplified herein (for instance, 1000) may comprise:
at least one electro-acoustical transducer;
exciter circuitry configured to apply to the at least one transducer an excitation signal over an excitation interval;
ring-down acquisition circuitry to acquire at the at least one transducer a ring-down signal indicative of the ring-down behavior of the transducer after the end of the excitation interval; and
signal processing circuitry configured to calculate, as a function of said ring-down signal, a resonance frequency of the at least one electro-acoustical transducer.

A circuit as exemplified herein may comprise control circuitry (for instance, CN, RG, BG) configured to control a bias voltage of the at least one electro-acoustical transducer as a function of the resonance frequency calculated to bring the resonance frequency of the electro-acoustical transducer to a reference frequency value.

A circuit as exemplified herein may be configured (via a same or different receiver transducer) to transduce an acoustical signal received into an electrical reception signal with said signal processing circuitry configured to calculate, as a function of said ring-down signal, a damping parameter of the electro-acoustical transducer, and synthesize, as a function of the resonance frequency and the damping parameter of the electro-acoustical transducer calculated, a cross-correlation reference signal (RE).

A circuit as exemplified herein cross-correlation circuitry (for instance, 40) may be provided to perform cross-correlation of the electrical reception signal and the cross-correlation reference signal.

A circuit (1000) as exemplified herein may be included in a device selected out of:
obstacle detection devices, optionally vehicle-mounted devices;
volume measurement devices;
gesture recognition devices;
flow metering devices; and
devices relying on time-of-flight measurement of sound waves.

Without prejudice to the underlying principles, the details and the embodiments may vary, even significantly, with respect to what has been described by way of example only, without departing from the scope of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
applying to an electro-acoustical transducer an excitation signal over an excitation interval;
sensing a ring-down signal indicative of a ring-down behavior of the electro-acoustical transducer after the excitation interval;
measuring a resonance frequency of the electro-acoustical transducer based on the ring-down signal;
transducing a received acoustical signal into an electrical reception signal;
determining, based on the ring-down signal, a damping parameter of the electro-acoustical transducer;
synthesizing a cross-correlation reference signal, based on the resonance frequency and the damping parameter; and
performing cross-correlation of the electrical reception signal and the cross-correlation reference signal.

2. The method of claim 1, further comprising:
adjusting the resonance frequency of the electro-acoustical transducer to a reference frequency value by controlling a bias voltage applied to the electro-acoustical transducer based on the resonance frequency.

3. The method of claim 1, wherein the damping parameter includes at least one of a damping ratio, a decay time constant, or a Q-factor representative of a damping behavior of the electro-acoustical transducer.

4. The method of claim 1, wherein the sensing the ring-down signal and the transducing the received acoustical signal into the electrical reception signal are performed concurrently.

5. The method of claim 1, further comprising:
calculating as a function of the resonance frequency and the damping parameter a Butterworth-Van Dyke model of the electro-acoustical transducer, wherein the Butterworth-Van Dyke model includes a simplified Butterworth-Van Dyke model with an electrical domain, an acoustical domain and a mechanical domain between the electrical domain and the acoustical domain, wherein the electrical domain of the simplified Butterworth-Van Dyke model has a constant capacitance and the mechanical domain of the model has a constant inductance, and
wherein the simplified Butterworth-Van Dyke model is exempt from mutual inductances coupling the electrical domain of the model with the mechanical domain of the model and coupling the mechanical domain of the model with the acoustic domain of the model.

6. The method of claim 5, further comprising:
calculating the Butterworth-Van Dyke model of the electro-acoustical transducer as a function of a damping parameter of the electro-acoustical transducer as $\tau = 2(L/R)$ wherein:
L is the constant capacitance of the mechanical domain of the model; and
R is a resistance representative of the transducer internal losses in the mechanical domain of the model.

7. The method of claim 1, further comprising:
applying an electrical transmission signal to a transmitter electro-acoustical transducer, wherein the electrical transmission signal is transduced into an acoustical transmission signal transmitted by the transmitter electro-acoustical transducer; and
receiving at a receiver electro-acoustical transducer an acoustical signal resulting from reflection of the acoustical transmission signal, wherein the acoustical signal received is transduced by the receiver electro-acoustical transducer into an electrical reception signal.

8. The method of claim 7, further comprising:
applying to both the transmitter electro-acoustical transducer and to the receiver electro-acoustical transducer, respective trains of excitation pulses over the excitation interval;
sensing at both the transmitter electro-acoustical transducer and the receiver electro-acoustical transducer, respective ring-down signals indicative of the ring-down behavior of the transducers after the excitation interval;
measuring a resonance frequency and a damping parameter of both the transmitter electro-acoustical transducer and the receiver electro-acoustical transducer based on the respective ring-down signals;
synthesizing the cross-correlation reference signal, based on the resonance frequency and the damping parameter of both the transmitter electro-acoustical transducer and the receiver electro-acoustical transducer; and
performing cross-correlation of the electrical reception signal and the cross-correlation reference signal.

9. The method of claim 8, further comprising:
applying the electrical transmission signal to a simplified Butterworth-Van Dyke model for the electro-acoustical transmitter transducer to produce a current signal representative of the acoustical transmission signal transmitted by the transmitter electro-acoustical transducer; and
applying a voltage signal which is a function of the current signal to the simplified Butterworth-Van Dyke model for an electro-acoustical receiver transducer to produce an output signal representative of the electrical reception signal at the electro-acoustical receiver transducer.

10. The method of claim 9, further comprising coupling to the simplified Butterworth-Van Dyke model for the electro-acoustical receiver transducer a filtering function representative of a transfer function of an analog front end coupled to the electro-acoustical receiver transducer, wherein the output signal representative of an electrical signal produced by the electro-acoustical receiver transducer is affected by the transfer function of the analog front end coupled to the electro-acoustical receiver transducer.

11. The method of claim 1, wherein the electro-acoustical transducer comprises a piezoelectric Micromachined Ultrasound Transducer (PMUT).

12. A circuit, comprising:
an electro-acoustical transducer;
exciter circuitry configured to apply to the electro-acoustical transducer an excitation signal over an excitation interval;
ring-down sensing circuitry configured to sense a ring-down signal indicative of a ring-down behavior of the electro-acoustical transducer after the excitation interval;

processing circuitry configured to measure a resonance frequency of the electro-acoustical transducer based on the ring-down signal;

a receiver transducer configured to:
transduce an acoustical signal received into an electrical reception signal;
determine, based on the ring-down signal, a damping parameter of the electro-acoustical transducer; and
synthesize a cross-correlation reference signal, based on the resonance frequency and the damping parameter; and cross-correlation circuitry configured to perform cross-correlation of the electrical reception signal and the cross-correlation reference signal.

13. The circuit of claim 12, further comprising:
control circuitry configured to adjust the resonance frequency of the electro-acoustical transducer to a reference frequency value by controlling a bias voltage of the electro-acoustical transducer based on the resonance frequency.

14. The circuit of claim 12, wherein the receiver transducer is configured to transduce the received acoustical signal into the electrical reception signal while the ring-down sensing circuitry senses the ring-down signal.

15. The circuit of claim 12, wherein the processing circuitry is configured to calculate as a function of the resonance frequency and the damping parameter a simplified Butterworth-Van Dyke model of the electro-acoustical transducer, the simplified Butterworth-Van Dyke model having an electrical domain, an acoustical domain and a mechanical domain between the electrical domain and the acoustical domain, wherein the electrical domain of the simplified Butterworth-Van Dyke model has a constant capacitance C0 and the mechanical domain has a constant inductance L, and
wherein the simplified Butterworth-Van Dyke model is exempt from mutual inductances coupling the electrical domain of the model with the mechanical domain of the model and coupling the mechanical domain of the model with the acoustic domain of the model.

16. The circuit of claim 15, wherein the processing circuitry is configured to calculate the Butterworth-Van Dyke model of the electro-acoustical transducer as a function of a damping parameter of the electro-acoustical transducer as $$\tau = 2(L/R)$$

wherein:
L is the constant capacitance of the mechanical domain of the model; and
R is a resistance representative of the transducer internal losses in the mechanical domain of the model.

17. The circuit of claim 12, wherein the electro-acoustical transducer comprises a piezoelectric Micromachined Ultrasound Transducer (PMUT).

18. A device, comprising:
a circuit including:
an electro-acoustical transducer;
exciter circuitry configured to apply to the electro-acoustical transducer an excitation signal over an excitation interval;
ring-down sensing circuitry configured to sense a ring-down signal indicative of a ring-down behavior of the electro-acoustical transducer after the excitation interval;
processing circuitry configured to measure a resonance frequency of the electro-acoustical transducer based on the ring-down signal;
a receiver transducer configured to:
transduce an acoustical signal received into an electrical reception signal;
determine, based on the ring-down signal, a damping parameter of the electro-acoustical transducer; and
synthesize a cross-correlation reference signal, based on the resonance frequency and the damping parameter; and
cross-correlation circuitry configured to perform cross-correlation of the electrical reception signal and the cross-correlation reference signal,
wherein the device is at least one of: an obstacle detection device, a vehicle-mounted device, a volume measurement device, a gesture recognition device, a flow metering device, or a time-of-flight measurement device utilizing sound waves.

19. The device of claim 18, wherein the circuit further includes control circuitry configured to adjust the resonance frequency of the electro-acoustical transducer to a reference frequency value by controlling a bias voltage of the electro-acoustical transducer based on the resonance frequency.

20. The device of claim 18, wherein the receiver transducer is configured to transduce the received acoustical signal into the electrical reception signal while the ring-down sensing circuitry senses the ring-down signal.

* * * * *